(12) United States Patent
Cheng et al.

(10) Patent No.: US 9,172,390 B2
(45) Date of Patent: Oct. 27, 2015

(54) DRIVING VOLTAGE GENERATOR AND DIGITAL TO ANALOG CONVERTER

(71) Applicant: Novatek Microelectronics Corp., Hsinchu (TW)

(72) Inventors: Jhih-Siou Cheng, New Taipei (TW); Ju-Lin Huang, Hsinchu County (TW); Pang-Chan Hung, Kaohsiung (TW)

(73) Assignee: Novatek Microelectronics Corp., Hsinchu (TW)

( * ) Notice: Subject to any disclaimer, the term of this patent is extended or adjusted under 35 U.S.C. 154(b) by 353 days.

(21) Appl. No.: 13/740,282

(22) Filed: Jan. 14, 2013

(65) Prior Publication Data

US 2014/0009506 A1 Jan. 9, 2014

(30) Foreign Application Priority Data

Jul. 5, 2012 (TW) .............................. 101124260 A

(51) Int. Cl.
*H03M 1/66* (2006.01)
*H03K 3/01* (2006.01)
*G09G 5/02* (2006.01)
*G09G 3/32* (2006.01)
*G09G 3/36* (2006.01)
*H03M 1/76* (2006.01)

(52) U.S. Cl.
CPC . *H03M 1/66* (2013.01); *G09G 5/02* (2013.01); *H03K 3/01* (2013.01); *G09G 3/3291* (2013.01); *G09G 3/3696* (2013.01); *G09G 2310/027* (2013.01); *G09G 2320/0276* (2013.01); *H03M 1/76* (2013.01); *H03M 1/765* (2013.01)

(58) Field of Classification Search
CPC .......................... G09G 3/3258–3/3291; G09G 3/3674–3/3696; G09G 2320/0271; G09G 2320/0276; G09G 2320/0673; G09G 5/02–5/06; G09G 2310/027; H03M 1/66; H03M 1/74–1/78; H03M 2201/3136–2201/3152

See application file for complete search history.

(56) References Cited

U.S. PATENT DOCUMENTS

2003/0137526 A1* 7/2003 Sakaguchi .................... 345/690
2004/0150607 A1 8/2004 Nakajima et al.
(Continued)

FOREIGN PATENT DOCUMENTS

CN 101132178 2/2008
CN 101359911 2/2009
(Continued)

OTHER PUBLICATIONS

"Office Action of Taiwan Counterpart Application", issued on Jul. 22, 2014, p. 1-p. 3.
(Continued)

*Primary Examiner* — Nathan Danielsen
(74) *Attorney, Agent, or Firm* — Jianq Chyun IP Office

(57) ABSTRACT

A digital to analog converter is disclosed. The digital to analog converter includes a voltage selector, M voltage transmitting switches and a selecting signal decoder. The voltage selector receives N first voltages among a plurality of analog input voltages, and receives a plurality of digital selecting signals. The voltage selector selects at most one of the first voltages for providing to an output terminal. One terminals of the voltage transmitting switches receives M second voltages among the input voltages respectively, and the voltage transmitting switches are turned on or off according to M transmitting enable signals respectively. The selecting signal decoder generates the transmitting enable signals according to the selecting signals. Wherein, M and N are positive integers.

11 Claims, 4 Drawing Sheets

(56) References Cited

U.S. PATENT DOCUMENTS

| | | | |
|---|---|---|---|
| 2008/0158033 A1* | 7/2008 | Doi et al. | 341/154 |
| 2009/0096816 A1* | 4/2009 | Kamijo et al. | 345/690 |
| 2010/0134528 A1 | 6/2010 | Kim et al. | |

FOREIGN PATENT DOCUMENTS

| | | |
|---|---|---|
| CN | 201854269 | 6/2011 |
| TW | 461180 | 10/2001 |
| TW | 200537405 | 11/2005 |
| TW | 200731210 | 8/2007 |
| TW | 200743083 | 11/2007 |
| TW | 200812250 | 3/2008 |
| TW | 200824302 | 6/2008 |
| TW | 200921622 | 5/2009 |

OTHER PUBLICATIONS

"Office Action of China Counterpart Application", issued on Jun. 24, 2015, p. 1-5.

* cited by examiner

DRIVING VOLTAGE GENERATOR AND DIGITAL TO ANALOG CONVERTER

CROSS-REFERENCE TO RELATED APPLICATION

This application claims the priority benefit of Taiwan application serial no. 101124260, filed on Jul. 5, 2012. The entirety of the above-mentioned patent application is hereby incorporated by reference herein and made a part of this specification.

BACKGROUND

1. Technical Field

The invention relates to a driving voltage generator and a digital-to-analog converter thereof.

2. Related Art

In a display device, in order to present images with correct gray levels on a display panel, a source driver of the display device is required to provide a correct gamma voltage to the display panel according to gray level data to be displayed on the display panel. Therefore, a digital to analog converter (DAC) is used on the source driver of the display device to produce an analog driving output voltage according to digital gray level data, and the display panel is driven to display images according to the driving output voltage.

Referring to FIG. 1, FIG. 1 is a circuit diagram of a DAC 100 of the conventional technique. The DAC 100 includes switches formed by a plurality of transistors MP1-MP11. The switches formed by the transistors MP1-MP7 are grouped into three stages, and the transistors MP1-MP4 arranged in a first stage respectively receive four gamma input voltages VP[n]-VP[n+3], and the transistors MP1, MP3 and the transistors MP2, MP4 are respectively controlled by selecting signals SEL[n] and SELB[n], wherein the selecting signal SELB[n] is an inverted signal of the selecting signal SEL[n]. Moreover, the transistors MP5 and MP6 arranged in a second stage respectively receive a voltage on a common coupling node of the transistors MP1 and MP2 and a voltage on a common coupling node of the transistors MP3 and MP4. The transistors MP5 and MP6 are respectively turned on or turned off under control of selecting signals SEL[n+1] and SELB[n+1]. The transistor MP7 is coupled to a common coupling node of the transistors MP5 and MP6, and is turned on or turned off under control of a selecting signal SELB[n+2], and the transistor MP7 is used to determine whether or not to provide the voltage on the common coupling node of the transistors MP5 and MP6 to serve as a driving output voltage VOUTP.

According to FIG. 1, it is known that when any of the gamma input voltages VP[n]-VP[n+3] is transmitted to serve as the driving output voltage VOUTP, it has to passes through three transistor switches. Namely, in the conventional DAC 100, a transmission path from which the gamma input voltage is transmitted to serve as the driving output voltage VOUTP has a certain transmission resistance. Such transmission resistance increases as the number of the gamma input voltages increases, which may even influence the quality of the driving output voltage VOUTP. Moreover, in the DAC 100 of the conventional technique, the number of the required transistor switches increases as the number of converted bits increases, which greatly increases a required circuit area.

SUMMARY

The invention is directed to a digital to analog converter (DAC), which effectively reduces a conducting resistance between an input voltage and an output voltage, and reduces a circuit layout area.

The invention is directed to a driving voltage generator, which effectively reduces a conducting resistance between an input voltage and an output voltage of a DAC, and reduces a circuit layout area.

The invention provides a digital to analog converter (DAC) including a voltage selector, M voltage transmitting switches and a selecting signal decoder. The voltage selector receives N first voltages among a plurality of input voltages of an analog format, and receives a plurality of selecting signals of a digital format. The voltage selector selects at most one of the first voltages for providing to an output terminal according to the selecting signals. Terminals of the voltage transmitting switches respectively receive M second voltages different to the first voltages among the input voltages, and other terminals of the voltage transmitting switches are commonly coupled to the output terminal. The voltage transmitting switches are respectively turned on or turned off according to M transmitting enable signals. The selecting signal decoder is coupled to the voltage transmitting switches, and generates the transmitting enable signals according to the selecting signals, where M and N are positive integers.

In an embodiment of the invention, at most one of the voltage transmitting switches is turned on according to the transmitting enable signals.

In an embodiment of the invention, when the voltage selector selects one of the first voltages for providing to the output terminal, the voltage transmitting switches are all turned off.

In an embodiment of the invention, when the voltage selector does not select any one of the first voltages for providing to the output terminal, one of the voltage transmitting switches is turned on.

The invention provides a driving voltage generator, which is adapted to a display device. The driving voltage generator includes a first digital to analog converter (DAC), and the first DAC includes a first voltage selector, M first voltage transmitting switches and a first selecting signal decoder. The first voltage selector receives N first voltages among a plurality of first gamma input voltages of an analog format, and receives a plurality of first selecting signals of a digital format. The first voltage selector selects at most one of the first voltages for providing to a first output terminal according to the first selecting signals. One terminals of the first voltage transmitting switches respectively receive M second voltages different to the first voltages among the first gamma input voltages, and other terminals of the first voltage transmitting switches are commonly coupled to the first output terminal. The first voltage transmitting switches are respectively turned on or turned off according to M first transmitting enable signals. The first selecting signal decoder is coupled to the first voltage transmitting switches, and generates the first transmitting enable signals according to the first selecting signals, where M and N are positive integers.

In an embodiment of the invention, the driving voltage generator further includes a second DAC. The second DAC includes a second voltage selector, M second voltage transmitting switches and a second selecting signal decoder. The second voltage selector receives N third voltages among a plurality of second gamma input voltages of the analog format, and receives a plurality of second selecting signals of the digital format. The second voltage selector selects at most one of the third voltages for providing to a second output terminal according to the second selecting signals. One terminals of the second voltage transmitting switches respectively receive M fourth voltages different to the second voltages among the second gamma input voltages, and other terminals of the second voltage transmitting switches are commonly coupled to the second output terminal. The second voltage transmitting switches are respectively turned on or turned off according to M second transmitting enable signals. The second selecting signal decoder is coupled to the second voltage transmitting switches, and generates the second transmitting enable signals according to the second selecting signals.

In an embodiment of the invention, the driving voltage generator further includes a gamma input voltage generator. The gamma input voltage generator is coupled to the first DAC and the second DAC for generating the first and the second gamma input voltages.

In an embodiment of the invention, the driving voltage generator further includes a driving voltage output buffer. The driving voltage output buffer is coupled to the first and the second output terminals, and the driving voltage output buffer selects a voltage on the first output terminal or the second output terminal according to a polarity selecting signal to generate a driving output voltage.

According to the above descriptions, in the DAC of the invention, one or a plurality of voltage transmitting switches are provided, and the input voltages received by the voltage transmitting switches are directly transmitted to the output terminal of the DAC according to the transmitting enable signals generated by the selecting signal decoder. In this way, the input voltages received by the voltage transmitting switches are unnecessary to be selected and output by a voltage selector having a complicated circuit structure, but can be directly transmitted to the output terminal of the DAC through the voltage transmitting switches at a required time, which may effectively reduce a resistance value of a path used for transmitting the input voltages to the output terminal. Moreover, by transmitting the input voltages through simple voltage transmitting switches, a circuit layout area can be effectively reduced. The invention further provides the driving voltage generator using the aforementioned DAC, and the driving voltage generator is adapted to a display device, and is used for providing a more accurate gamma input voltage to serve as the driving output voltage, so as to improve display performance.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
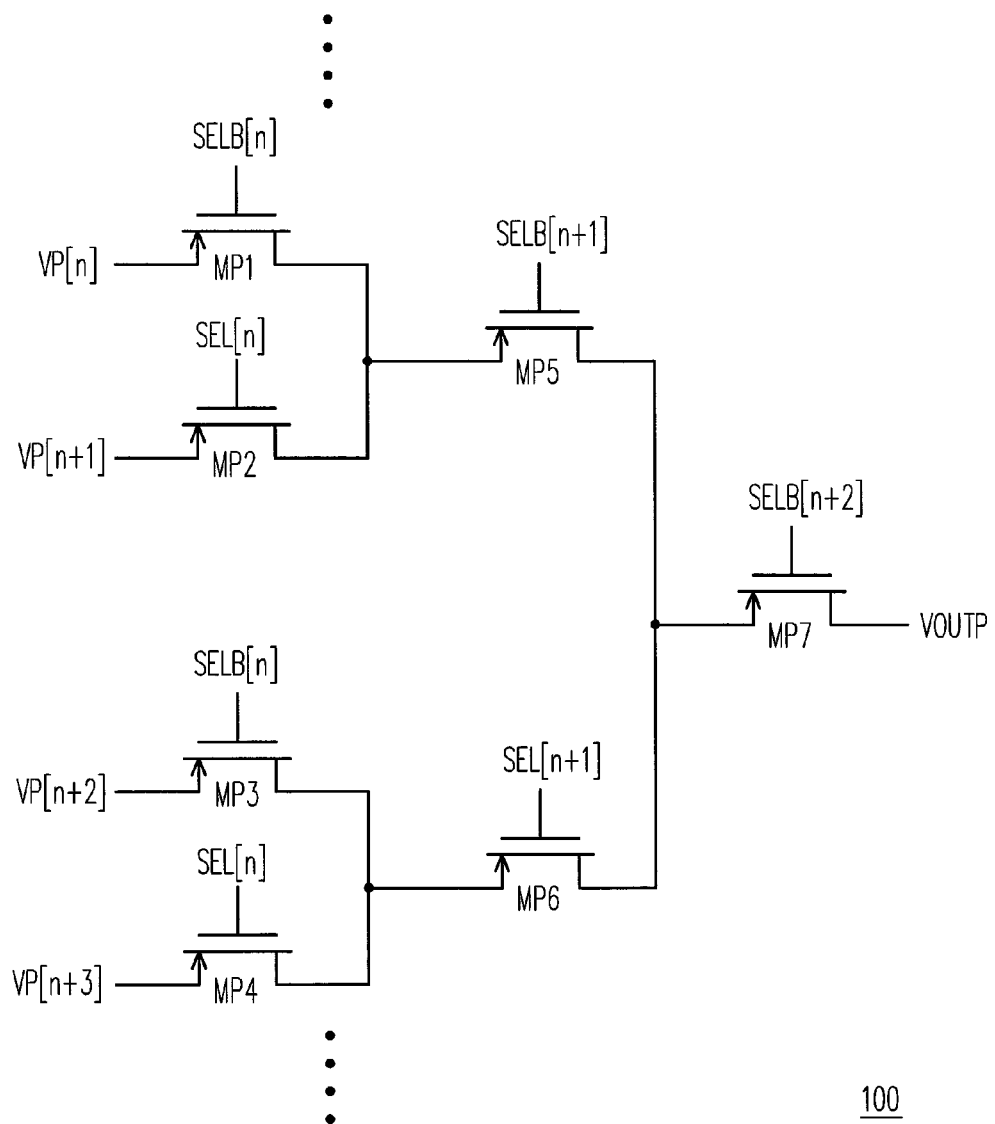
FIG. 1 is a circuit diagram of a digital to analog converter (DAC) 100 of a conventional technique.
Figure 2:
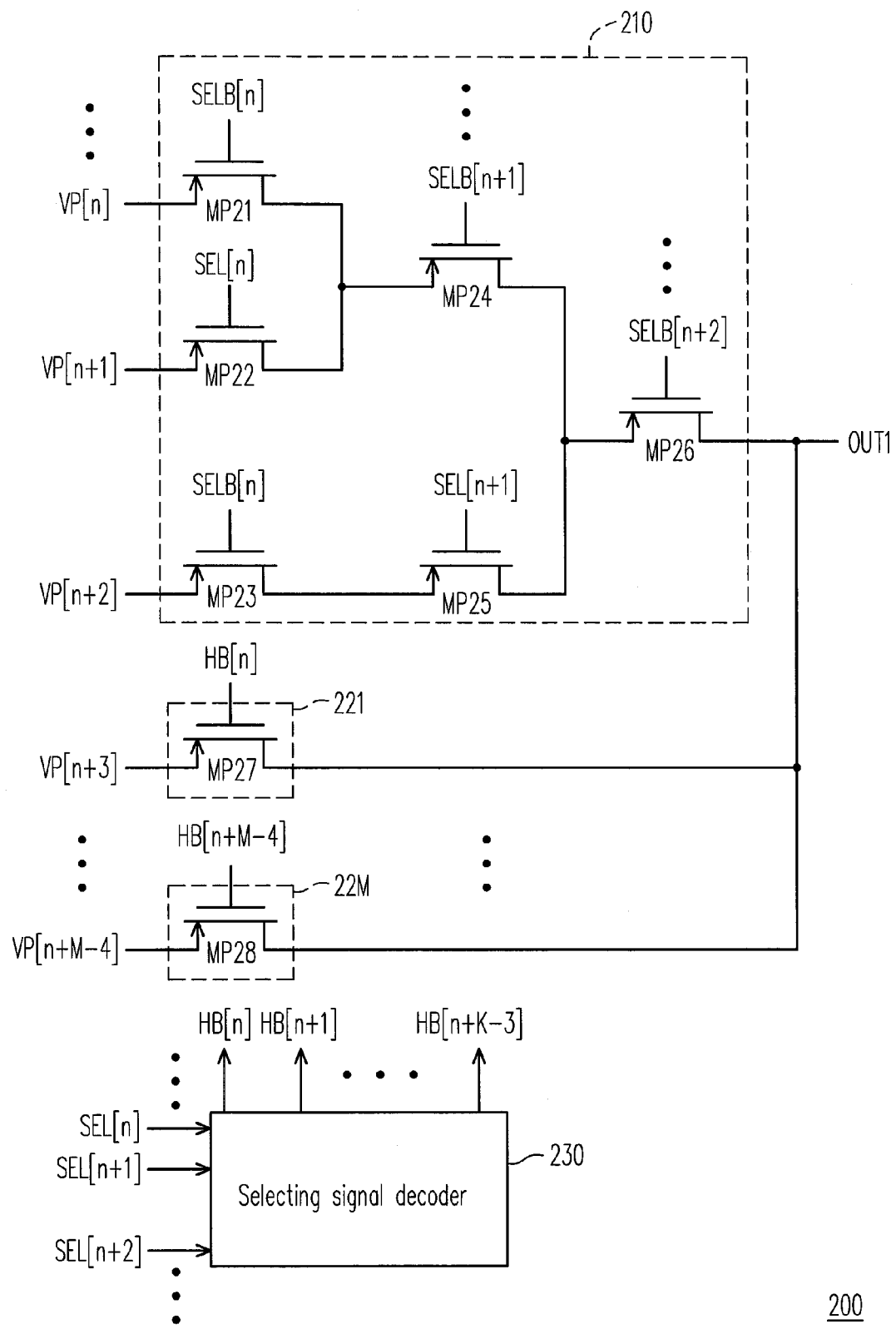
FIG. 2 is a schematic diagram of a DAC 200 according to an embodiment of the invention.

Referring to FIG. 2, FIG. 2 is a schematic diagram of a digital to analog converter (DAC) 200 according to an embodiment of the invention. The DAC 200 includes a voltage selector 210, voltage transmitting switches 221-22M and a selecting signal decoder 230. The voltage selector 210 receives voltages VP [n]-VP[n+2] among a plurality of input voltages VP[n]-VP[n+M−4] of an analog format, and receives a plurality of selecting signals SEL[n]-SEL[n+2] and selecting signals SELB[n]-SELB[n+2] of a digital format, where the selecting signals SELB[n]-SELB[n+2] are respectively inverted signals of the selecting signals SEL[n]-SEL[n+2]. The voltage selector 210 selects at most one of the voltages VP[n]-VP[n+2] for providing to an output terminal OUT1 according to the selecting signals SEL[n]-SEL[n+2] and SELB[n]-SELB[n+2].

In the present embodiment, the voltage selector 210 includes a plurality of switches formed by transistors MP21-MP26. The transistors MP21 and MP22 are used to select one of the input voltages VP[n] and VP[n+1] for transmitting to one terminal of the transistor MP24. The transistor MP21 is turned on or turned off under control of the selecting signal SELB[n], and the transistor MP22 is turned on or turned off under control of the selecting signal SEL[n]. Moreover, the transistor MP23 receives the input voltage VP [n+2], and is controlled by the selecting signal SELB[n]. Namely, when the transistors MP21 and MP22 transmit the input voltage VP[n] to the transistor MP24 according to the selecting signals SEL[n] and SELB[n] (the input voltage VP[n] is equal to a voltage V1), the transistor MP23 is simultaneously turned on, and transmits the input voltage VP[n+2] to one terminal of the transistor MP25 (the input voltage VP[n+2] is equal to a voltage V2). Comparatively, when the transistors MP21 and MP22 transmit the input voltage VP[n+1] to the transistor MP24 according to the selecting signals SEL[n] and SELB[n] (the input voltage VP[n+1] is equal to the voltage V1), the transistor MP23 is turned off, and a coupling node between the transistor MP23 and the transistor MP25 is in a floating state (the voltage V2 has a high impedance).

The transistors MP24 and MP25 are used to select one of the voltages V1 and V2 for outputting to the transistor MP26 under control of the selecting signals SELB[n+1] and SEL[n+1]. The transistor M26 is turned on or turned off under control of the selecting signal SELB[n+2], and determines whether or not to output one of the voltages V1 and V2 to the output terminal OUT1 to serve as an output voltage.

Moreover, in the present embodiment, the voltage transmitting switches 221-22M are respectively implemented by transistors MP27-MP28. The transistors MP27-MP28 are respectively turned on or turned off under control of transmitting enable signals HB[n]-HB[n+M−4]. It should be noticed that at most one of the transistors MP27-MP28 is turned on for directly transmitting one of the received input voltages VP [n+3]-VP [n+M−4] to the output terminal OUT1. Moreover, the transistor MP26 in the voltage selector 210 is now in a turn-off state. The aforementioned n and M are all positive integers.

Certainly, the transistors MP27-MP28 can be all turned off, and the voltage transmitting switches 221-22M do not transmit any voltage to the output terminal OUT1, and in this case, the transistor MP26 in the voltage selector 210 must be in a turn-on state and transmits a voltage on a coupling node of the transistors MP24 and MP25 to the output terminal OUT1.

It should be noticed that the input voltages VP[n+3]-VP[n+M−4] can be transmitted to the output terminal OUT1 through one of the voltage transmitting switches 221-22M constructed by the single transistor MP27 or MP28. Namely, when the DAC 200 transmits one of the input voltages VP[n+3]-VP[n+M−4] to serve as the output voltage, a transmission impedance is very small. Under a high speed operation of the DAC 200, a delay time required for effectively transmitting the input voltages VP[n+3]-VP[n+M−4] with relatively great voltage absolute values to the output terminal OUT1 can be effectively shortened. Namely, the output voltage generated by the DAC 200 can be more accurate.

The selecting signal decoder 230 is coupled to the voltage transmitting switches 221-22M, and receives the selecting signals SEL[n]-SEL[n+2]. The selecting signal decoder 230 generates the transmitting enable signals HB[n]-HB[n+M−4] according to the selecting signals SEL[n]-SEL[n+2] and/or inverted signals SELB[n]-SELB[n+2] thereof. The selecting signal decoder 230 can be implemented by a logic operation circuit. For example, in case that the transistors MP21-MP28 are all P-type transistors, when the DAC 200 transmits one of the input voltages VP[n+3]-VP[n+M−4] to the output terminal OUT1 according to the selecting signals SEL[n]-SEL[n+2], the selecting signal decoder 230 makes one of the transmitting enable signals HB[n]-HB[n+M−4] to a logic low level, and makes other transmitting enable signals to a logic high level.

Figure 3:
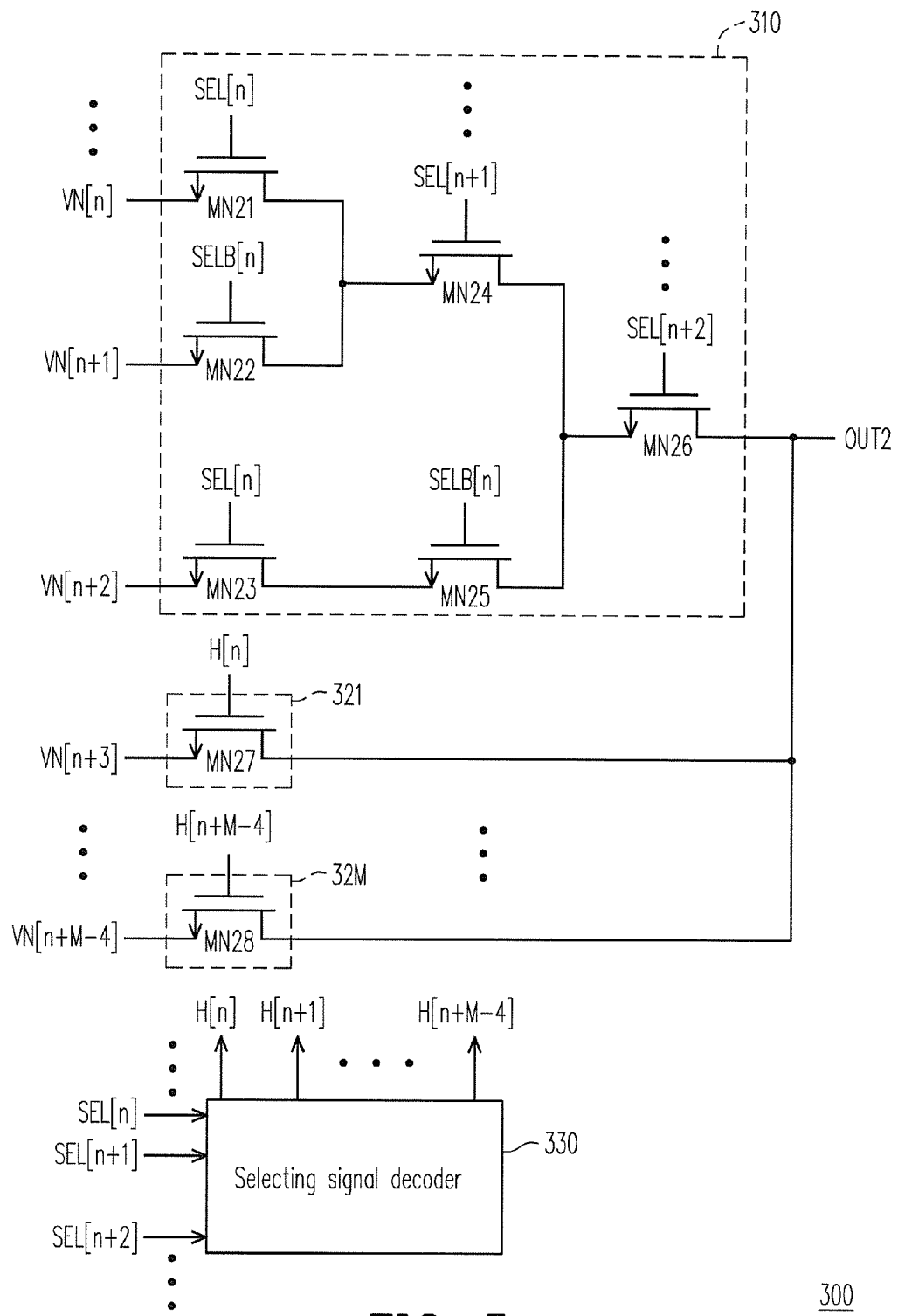
FIG. 3 is a schematic diagram of a DAC 300 according to another embodiment of the invention.

Referring to FIG. 3, FIG. 3 is a schematic diagram of a DAC 300 according to another embodiment of the invention. The DAC 300 includes a voltage selector 310, voltage transmitting switches 321-32M and a selecting signal decoder 330. The voltage selector 310 receives voltages VN[n]-VN[n+2] among a plurality of input voltages VN[n]-VN[n+M−4] of the analog format, and receives a plurality of selecting signals SEL[n]-SEL[n+2] and selecting signals SELB[n]-SELB[n+2] of the digital format, where the selecting signals SELB[n]-SELB[n+2] are respectively inverted signals of the selecting signals SEL[n]-SEL[n+2]. The voltage selector 310 selects at most one of the voltages VP[n]-VP[n+2] for providing to an output terminal OUT2 according to the selecting signals SEL[n]-SEL[n+2] and SELB[n]-SELB[n+2]. Terminals of the voltage transmitting switches 321-32M respectively receive voltages VN[n+3]-VN[n+M−4] among the input voltages VN[n]-VN[n+M−4]. Other terminals of the voltage transmitting switches 321-32M are commonly coupled to the output terminal OUT2. The voltage transmitting switches 321-32M are respectively turned on or turned off according to transmitting enable signals H[n]-H[n+M−4].

Different to the embodiment of FIG. 2, the switches of the present embodiment are all implemented by N-type transistors, so that signals used for controlling transistors MN21-MN28 are all inverted to signals used for controlling the transistors MP21-MP28 of FIG. 2. Operation details of the present embodiment are similar to that of the embodiment of FIG. 2, which are not repeated.

Figure 4:
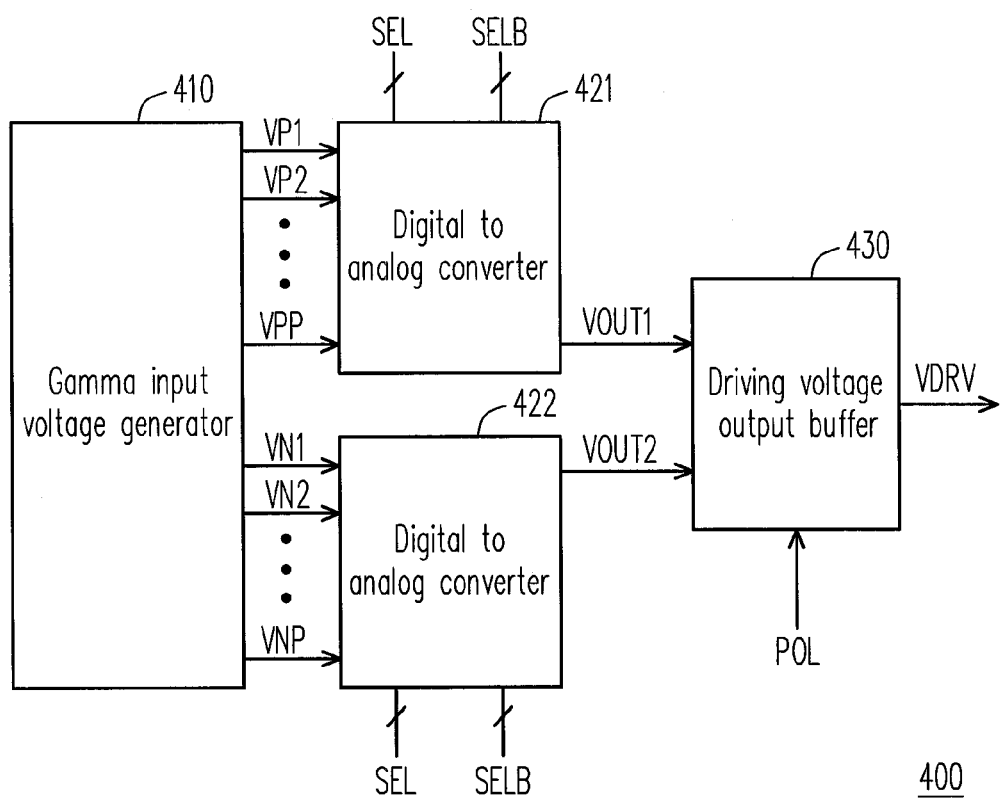
FIG. 4 is a driving voltage generator 400 according to an embodiment of the invention.

Referring to FIG. 4, FIG. 4 is a driving voltage generator 400 according to an embodiment of the invention. The driving voltage generator 400 is adapted to a display device, and the display device is, for example, a liquid crystal display (LCD) or a light-emitting diode (LED) display, etc. In the present embodiment, the display device is, for example, an LCD, and the driving voltage generator 400 includes a gamma input voltage generator 410, DACs 421 and 422, and a driving voltage output buffer 430. The gamma input voltage generator 410 is coupled to the DACs 421 and 422, and is used for generating gamma input voltages VP1-VPP and VN1-VNP. The DACs 421 and 422 respectively receive the gamma input voltages VP1-VPP and VN1-VNP and selecting signals SEL and SELB, and respectively generate output voltages VOUT1 and VOUT2 the output terminals thereof for outputting to the driving voltage output buffer 430. The driving voltage output buffer 430 is coupled to the output terminals of the DACs 421 and 422, and selects one of the voltages on the output terminals of the DACs 421 and 422 according to a polarity selecting signal POL to generate a driving output voltage VDRV.

It should be noticed that regarding implementation details of the DACs 421 and 422, the DAC 421 can be implemented by the DAC 200 of the embodiment of FIG. 2, and the DAC 422 can be implemented by the DAC 300 of the embodiment of FIG. 3, where the DAC 421 is used to select the positive gamma input voltages VP1-VPP to generate the output voltage VOUT1, and the DAC 422 is used to select the negative gamma input voltages VN1-VNP to generate the output voltage VOUT2.

Moreover, the selecting signals SEL and SELB can be generated according to gray level data of a frame to be displayed by the display device. Generally, each of the selecting signals SEL and SELB makes the DACs 421 and 422 to respectively generate the output voltages VOUT1 and VOUT2, where the selecting signal SEL is inverted to the selecting signal SELB.

Here, the DACs 421 and 422 are not all necessary, and if the DACs are applied to the LED display that the driving voltage generator 400 does not have driving polarity, one of the DACs 421 and 422 can be used according to positive and negative of the driving output voltage. Certainly, in this case, the driving voltage output buffer 430 is unnecessary to receive the polarity selecting signal POL, and only driving capability of the output voltage VOUT1 or VOUT2 is required to be strengthened to generate the driving output voltage VDRV.

In summary, in the DAC of the invention, besides the voltage selector, voltage transmitting switches are further configured, and it is set that a part of the voltages in the input voltages are transmitted to the output terminal of the DAC through the voltage transmitting switches. In this way, when the input voltages coupled to the voltage transmitting switches are transmitted, the input voltages are unnecessary to pass through a voltage transmission path with a high impedance, so that the input voltages can be quickly transmitted to the output terminal, which enhances a voltage conversion efficiency of the DAC. Moreover, by configuring the simple voltage transmitting switches, a circuit area can be effectively decreased to save a cost. It should be noticed that the DAC of the invention can be applied to a driving voltage generator of a display device, and in case that a displayed frame has a high frame refreshing rate, display performance can be effectively improved and the number of circuit components are decreased, and both of product quality and price competitiveness are enhanced.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:
1. A digital to analog converter, comprising:
a voltage selector, receiving N first voltages among a plurality of input voltages of an analog format, and the voltage selector receiving a plurality of selecting signals of a digital format, wherein the voltage selector selects at most one of the first voltages for providing to an output terminal according to the selecting signals;
M voltage transmitting switches, terminals of the voltage transmitting switches respectively receiving M second voltages different from the first voltages among the input voltages, and other terminals of the voltage transmitting switches being commonly coupled to the output terminal, wherein the voltage transmitting switches are respectively turned on or turned off according to M transmitting enable signals; and a selecting signal decoder, coupled to the voltage transmitting switches, and generating the transmitting enable signals according to the selecting signals, wherein M and N are positive integers.

2. The digital to analog converter as claimed in claim 1, wherein at most one of the voltage transmitting switches is turned on according to the transmitting enable signals.

3. The digital to analog converter as claimed in claim 2, wherein when the voltage selector selects one of the first voltages for providing to the output terminal, the voltage transmitting switches are all turned off.

4. The digital to analog converter as claimed in claim 2, wherein when the voltage selector does not select any one of the first voltages for providing to the output terminal, one of the voltage transmitting switches is turned on.

5. A driving voltage generator, adapted to a display device, and comprising:
- a first digital to analog converter, comprising:
- a first voltage selector, receiving N first voltages among a plurality of first gamma input voltages of an analog format, and receives a plurality of first selecting signals of a digital format, wherein the first voltage selector selects at most one of the first voltages for providing to a first output terminal according to the first selecting signals;
- M first voltage transmitting switches, terminals of the first voltage transmitting switches respectively receiving M second voltages different from the first voltages among the first gamma input voltages, and other terminals of the first voltage transmitting switches being commonly coupled to the first output terminal, wherein the first voltage transmitting switches are respectively turned on or turned off according to M first transmitting enable signals; and
- a first selecting signal decoder, coupled to the first voltage transmitting switches, and generating the first transmitting enable signals according to the first selecting signals, wherein M and N are positive integers.

6. The driving voltage generator as claimed in claim 5, further comprising:
- a second digital to analog converter, comprising:
- a second voltage selector, receiving N third voltages among a plurality of second gamma input voltages of the analog format, and receiving a plurality of second selecting signals of the digital format, wherein the second voltage selector selects at most one of the third voltages for providing to a second output terminal according to the second selecting signals;
- M second voltage transmitting switches, terminals of the second voltage transmitting switches respectively receiving M fourth voltages different from the third voltages among the second gamma input voltages, and other terminals of the second voltage transmitting switches being commonly coupled to the second output terminal, wherein the second voltage transmitting switches are respectively turned on or turned off according to M second transmitting enable signals; and
- a second selecting signal decoder, coupled to the second voltage transmitting switches, and generating the second transmitting enable signals according to the second selecting signals.

7. The driving voltage generator as claimed in claim 6, further comprising:
- a gamma input voltage generator, coupled to the first digital to analog converter and the second digital to analog converter, and generating the first and the second gamma input voltages.

8. The driving voltage generator as claimed in claim 6, further comprising:
- a driving voltage output buffer, coupled to the first and the second output terminals, and selecting a voltage on the first output terminal or the second output terminal according to a polarity selecting signal to generate a driving output voltage.

9. The driving voltage generator as claimed in claim 6, wherein at most one of the first voltage transmitting switches is turned on according to the first transmitting enable signals, and at most one of the second voltage transmitting switches is turned on according to the second transmitting enable signals.

10. The driving voltage generator as claimed in claim 9, wherein when the first voltage selector selects one of the first voltages for providing to the first output terminal, the first voltage transmitting switches are all turned off, and when the second voltage selector selects one of the third voltages for providing to the second output terminal, the second voltage transmitting switches are all turned off.

11. The driving voltage generator as claimed in claim 9, wherein when the first voltage selector does not select any one of the first voltages for providing to the first output terminal, one of the first voltage transmitting switches is turned on, and when the second voltage selector does not select any one of the third voltages for providing to the second output terminal, one of the second voltage transmitting switches is turned on.

* * * * *